United States Patent [19]
Inoh et al.

[11] Patent Number: 5,652,561
[45] Date of Patent: Jul. 29, 1997

[54] LAMINATING TYPE MOLDED COIL

[75] Inventors: Kiyoharu Inoh; Hisanaga Takano, both of Tokyo; Eiji Sumiya; Akihiro Demura, both of Ohgaki, all of Japan

[73] Assignees: Yokogawa Electric Corporation, Tokyo; Ibiden Company, Limited, Ohgaki, both of Japan

[21] Appl. No.: 261,738

[22] Filed: Jun. 17, 1994

[30]     Foreign Application Priority Data

Jun. 29, 1993 [JP] Japan .................................. 5-158596
Jul. 21, 1993 [JP] Japan .................................. 5-180402

[51] Int. Cl.⁶ .................................................. H01F 5/00
[52] U.S. Cl. ................................... 336/200; 336/205
[58] Field of Search ................................ 336/200, 205; 333/246; 29/602.1

[56]              References Cited

U.S. PATENT DOCUMENTS

| | | | |
|---|---|---|---|
| 5,392,019 | 2/1995 | Ohkubo | 336/200 |
| 5,398,400 | 3/1995 | Breen | 29/602.1 |
| 5,402,098 | 3/1995 | Ohta et al. | 336/200 |
| 5,430,424 | 7/1995 | Sato et al. | 336/200 |
| 5,461,353 | 10/1995 | Eberhardt | 333/246 |
| 5,463,365 | 10/1995 | Iwatani et al. | 336/98 |
| 5,487,214 | 1/1996 | Walters | 29/602.1 |

*Primary Examiner*—Patrick J. Stanzione
*Assistant Examiner*—G. R. Lord
*Attorney, Agent, or Firm*—Moonray Kojima

[57]              ABSTRACT

A laminating type molded coil and a method of fabricating the same comprising at least one coil substrate structure in which coils are formed on both sides of an insulating substrate by use of a printed wire technique, resin sheets disposed on both side of the coil substrate structure, and insulating covering sheets disposed on the outermost surfaces of the resin sheets, wherein when heated and subjected to pressure the spaces between the layers and between the coils are filled with resin from the resin sheets, and then hardened to produce an integral structure. Advantageously, because the coil pattern has a predetermined shape and is formed by printed wire techniques, the thickness of the coils may be thin and the gaps between the coils may be narrow. By using the invention method, the fabrication does not require use of a molding box as does the conventional method and the fabrication is done with simple steps.

16 Claims, 13 Drawing Sheets

LAMINATING TYPE MOLDED COIL

BACKGROUND OF THE INVENTION

1. Field of Invention

This invention relates to a laminating type molded coil and a method of fabricating the same, wherein the coil to be molded is formed on an insulating substrate using a printed wiring technique and wherein the construction of said coil is simple and suitable for mass production.

2. Description of the Prior Art

Various power supply transformers, which comprise one or more coils, are widely used in industrial equipment and domestic appliances. The transformers should have good signal insulating properties and good reliability. In the art, arrangements have been disclosed for forming coils using various techniques. For example see Japan Laid-Open patent No. 58-155,711 and 60-245,208.

Figure 1:
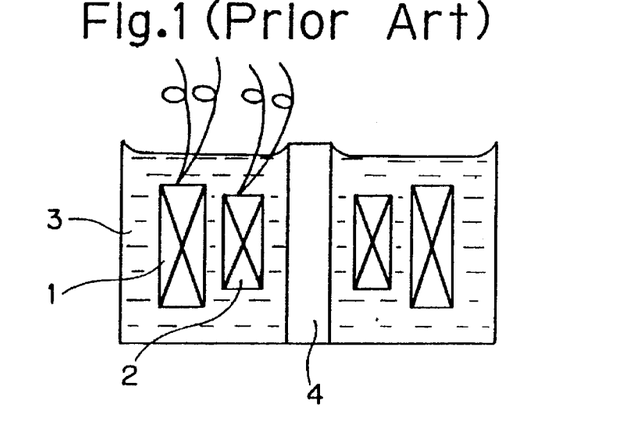
FIG. 1 is a conceptual longitudinal cross sectional view of an exemplary structure of a conventional molded coil.

FIG. 1 shows conceptually an example of the construction of a prior art molded coil, wherein primary coil 1 and secondary coil 2 are wound in a cylindrical shape and are disposed in a concentric manner in a circumferential direction thereof. The coils may be formed using a printed wiring technique. An insulating layer section 3 is formed by a resin covering the space between the coils 1,2 and the outer periphery thereof and a core is formed about a through hole 4 when a transformer is constructed.

Figure 2:
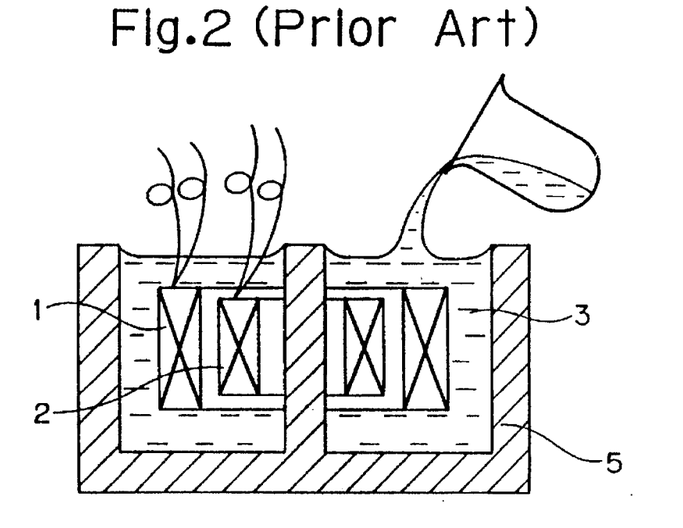
FIG. 2 is a conceptual longitudinal cross sectional view depicting a method of fabricating the coil of FIG. 1.

FIG. 2 explains conceptual a method of forming the molded coil of FIG. 1, wherein, first a molding box 5 having a predetermined size and capable of accommodating coils 1,2 is prepared. Then, the coils 1,2 are placed therein concentrically in the circumferential direction thereof. Then, a thermosetting resin, such as epoxy resin is placed between and around the coils, and then heated so as to melt and mold the resin between and about the coils. Then, the resin is allowed to harden, after which, molding box 5 is removed from the core arrangement. Then, the process is completed by a secondary hardening and slow cooling process. The resin is usually in pellet form.

This type of prior art molded coil and method of forming same have the following problems. First, it is not suited for mass production because a separate molding box is needed for each different size of coil, and also, the resin takes a long time to liquify and then solidify. Second, the dimension of the coil cannot be reduced because there must be a definite sized gap between the coils and at the outer peripheries thereof in order for the resin to be placed and hardened in the gaps.

SUMMARY OF THE INVENTION

Accordingly, it is an object of the invention to overcome the foregoing and other problems and deficiencies of the prior art.

Another object is to provide a laminating type molded coil which can be miniaturized, is highly efficient, is economical and is suited for mass production.

A further object is to provide a way to readily prepare a core when using a laminating type molded coil in a transformer.

The foregoing and other objects are attained in the invention, which encompasses a laminating type molded coil comprising at least one coil substrate structure in which coils are formed on both sides of a flat insulating substrate by use of a printed wiring technique, resin sheets disposed on both sides of the coil-substrate structure, insulating coatings disposed on the outermost surfaces of the resin sheets, and wherein the foregoing components are formed into an integral structure by filling in the spaces between the coils and between the layers with resin from the resin sheets.

The invention also encompasses a method for fabricating the laminating type molded coil, comprising the steps of forming coils on both sides of the insulating substrate by use of a printed wiring technique, laminating resin sheets on both sides of the coil-substrate structure, placing an insulating coating on the outermost surfaces of the resin sheets, and then applying heat and pressure to the combined structure whereby resin from the resin sheets is caused to liquify and fill in the spaces between the coils and between the substrate and coatings and then to harden thereby producing an integral structure.

According to the invention, because a coil pattern having a predetermined shape and a lead wire or terminal pattern having a predetermined shape are formed on the substrate by use of a printed wiring technique, advantageously, the thickness of the patterns may be thinned and the spaces between the coil patterns may be narrowed. Also, advantageously, when the resin sheet is heated and subjected to pressure, the resin material in the sheet is caused to become generally liquified and readily fills the spaces between the coils and between the various layers of the structure, such as between the insulating layer and the coatings, and then is hardened. Upon hardening, the device is produced as a unitary integral structure comprising the insulating substrate, the coils and the coatings or cover sheets.

BRIEF DESCRIPTION OF THE DRAWINGS

FIGS. 5(a)-5(c2) are explanatory views depicting a method for fabricating a laminating type molded coil using two coil-substrate structures, and wherein the coils are electrically connected to each other within the molded structure.

FIGS. 6(c-1) and 6(c-2) are explanatory views depicting another fabricating method wherein a terminal for connection to outside circuits is formed in the fabricating method of FIGS. 5(a)-5(c2).

FIGS. 7(a)-7(c1) are explanatory views depicting another method for fabricating a laminating type molded coil using a plurality of coil-substrate structures, and wherein coils are electrically connected to each other within a molded structure.

FIGS. 12(a)-12(d) are perspective views depicting another illustrative fabricating method of the invention.

DETAILED DESCRIPTION OF THE PREFERRED EMBODIMENTS

Figure 3:
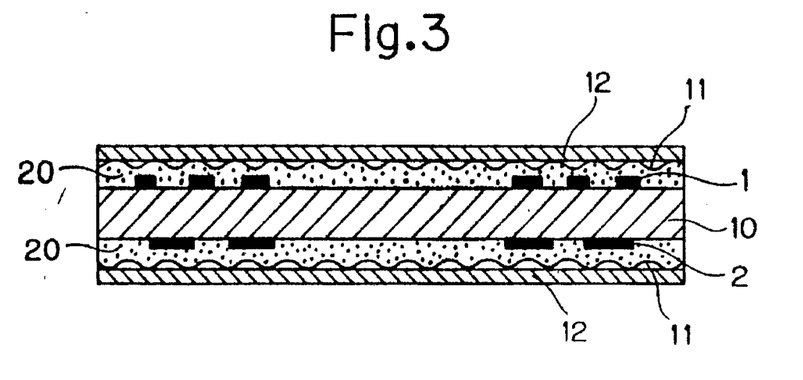
FIG. 3 is a cross sectional view of a structure of an illustrative embodiment of the invention.

In FIG. 3, insulating substrate 10 may comprise, for example, a resin material or an insulating film. A coil substrate structure is formed by forming coils 1 and 2 on both sides of insulating substrate 10 by use of a printed wiring technique, such as etching, evaporating, electrolysis plating, etc. Although the example uses one coil substrate structure, two or more coil substrate structures can also be used, as desired.

Resin sheets 11 are placed on both sides of the coil-substrate structure as shown. The resin sheets 11 may be one which is formed by impregnating and semi-hardening a resin material containing a filler, such as epoxy resin and non-organic material, in a cloth or sheet comprising glass fiber, for example, a "prepreq" sheet, or a sheet formed of resin material which is dried or semi-hardened When the resin sheets are heated and subjected to pressure, the resin material forming the sheet or impregnated in the cloth becomes liquified and flows out of the cloth.

Insulating coating 12 (also called cover sheets) are placed on both sides of the surfaces, which are the outmost surfaces of the resin sheets covering the coil-substrate structure. Resin material 20 flows out of resin sheet 11 and fills the spaces between the coils and between the coil-substrate structure and the cover sheets. The resin then hardens, and an integral structure is formed of the coil-substrate structure covered with the covering sheets.

Figure 4A:
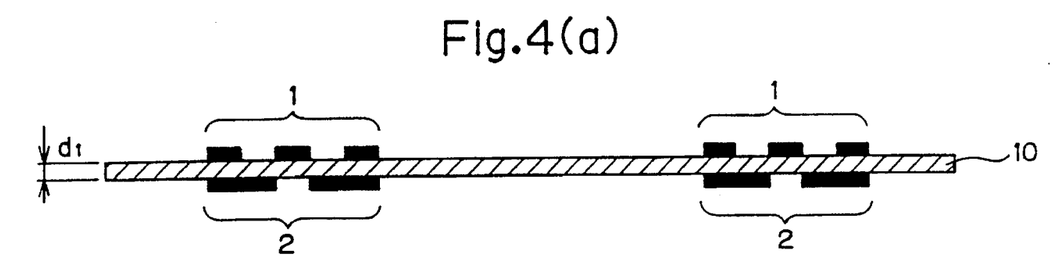
FIGS. 4(a)-4(c) are explanatory views depicting steps in a method for fabricating the laminating type molded coil of FIG. 3.
Figure 4B:
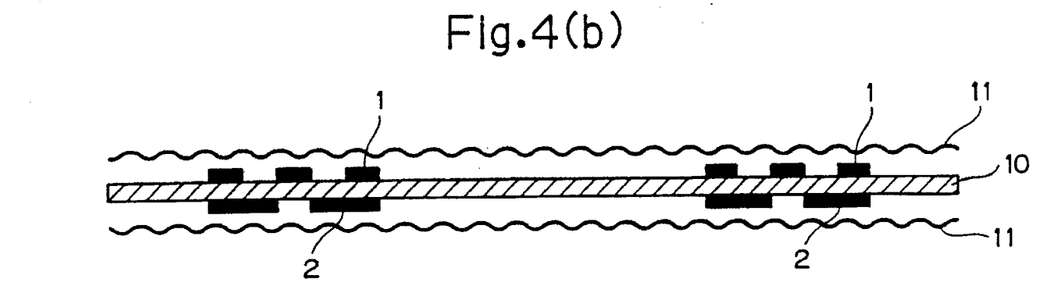
Figure 4C:
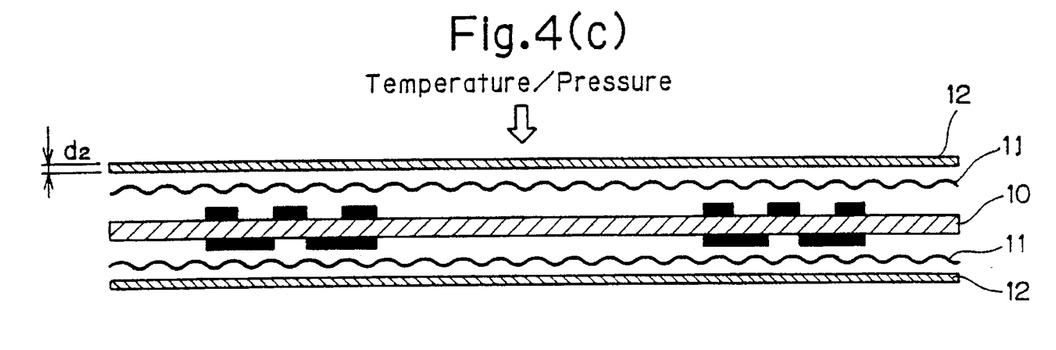

FIGS. 4(a)–4(c) show the steps of fabricating the laminating type molded coil shown in FIG. 3.

[Process (a) shown in FIG. 4(a)]

First, the coils 1 and 2 are fabricated, respectively, on both sides of insulating substrate 10, by use of a printed wiring technique. A pattern for forming lead wires from each coil and for forming terminals is formed together with the coils as desired. Coils 1 and 2 are separately disposed on opposite sides of the substrate 10 and are insulated from each other. Coils formed on one surface can be primary coils, for example, and coils formed on the other surface can be secondary coils. The shapes of the coil patterns are selected, e.g. concentric spiral shapes, so that they are effectively mutually magnetically coupled, and the size and other characteristics of each coil are selected according to the current to flow therein, etc.

The thickness d1 insulating substrate 10 is also selected according to the degree of insulation desired between the coils. For example, when a resin substrate is used and if it is desired that the substrate withstand a voltage of 10 KV, then the substrate should have a thickness d1 of 0.2 mm. If the amount of voltage to be withstood is 2,500 V, the substrate should have a thickness d1 of about 0.05 mm.

[Process (b) shown in FIG. 4(b)]

The resin sheets 11 are laminated or otherwise disposed on both sides of the coil-substrate structure or combination obtained in the above described process (a). If more than two coil-substrate structures are used, a resin sheet is placed between the two coil-substrate structures. That is, the coil substrate structures and resin sheets are alternately disposed.

In such a case, the two coil substrate structures are disposed so that the coils which face each other are primary coils or secondary coils so that a high degree of insulation would not be required therebetween, with resin sheet 11 positioned therebetween. A plurality of coil substrate structures can be repetively disposed separated by resin sheets and with resin sheets covering the exposed surfaces, and then covered by covering sheets of insulating material.

[Process (c) shown in FIG. 4(c)]

The cover sheets 12 which have a thickness d2 and which are made of an insulating material, are laminated or otherwise disposed on the outermost surfaces of the structure completed by the previous steps, that is on the resin sheets 11. Then, the combined structure comprising the substrate 10, coils 1,2, resin sheets 11, and cover sheets 12, is subjected to heat and pressure so that the spaces between the coils and between the coil substrate structure and the cover sheets are filled with resin from the resin sheets and then hardened to thereby to produce an integral structure. The heating and pressurizing operations are carried out preferably in a vacuum, so that no cavities will remain after filling of the spaces with the resin. Because the substrate 10 and cover sheets or coatings 12 are of insulating material, their thicknesses are not substantially altered during heating and pressurizing operations.

Then, the resin, which flowed from the resin sheet 11, is hardened to complete the fabrication process. When the laminating type molded coil is used for a transformer, a through hole is used to mount the core to a laminating plate and for connecting lead wires to terminals.

Because the distance between coils 1 and 2 is restricted by thickness d1 of insulating substrate 10, and the distance between coil 1 and the outside surface of the entire structure, and the distance between coil 2 and the outer surface of the entire structure is restricted by thickness d2 of cover sheet 12, the respective distances between the coils and between the coils and the outer surfaces can be accurately controlled by controlling the thicknesses d1 and d2 of the layers 10 and 12, which are of insulating material. Furthermore, when the coil is formed into a spiral shape, the distance between the coil conductors, which depends on processing accuracy of the printed wiring technique, may also be accurately controlled Accordingly, the invention advantageously produces a reliable laminating type molded coil having a stable structure.

Figure 5:
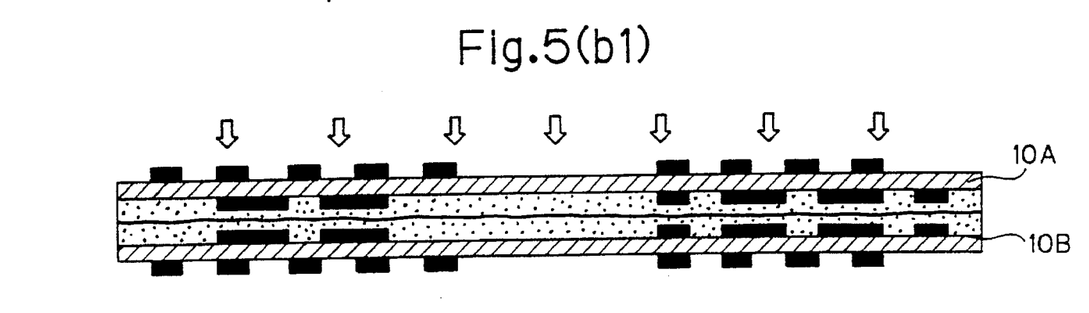
Figure 5A:
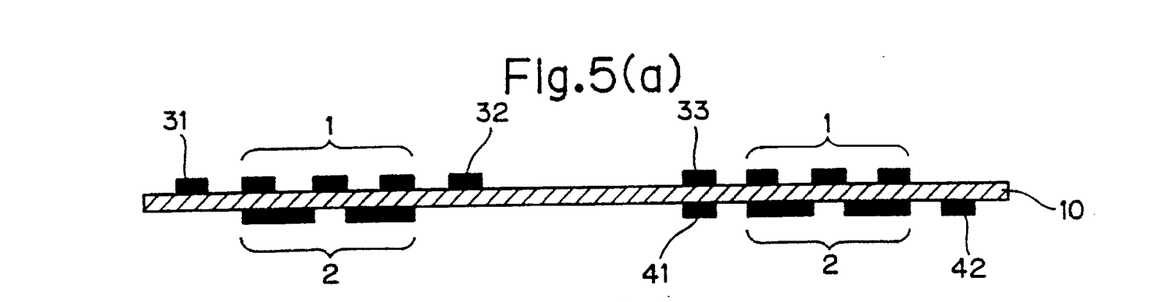

FIGS. 5(a)–5(c2) show method steps for fabricating a laminating type molded coil using two coil substrate structures and wherein the coils are electrically connected to each other within the molded structure.

[Process (a) shown in FIG. 5(a)]

Coils 1 and 2, terminals for connecting the coils, and terminals for connecting outside circuits 31, 32, 33, 41 and 42, are formed, respectively, on both sides of substrate 10 by using a printed wiring technique. The terminals for connecting the coils 1,2 are determined by considering the shape of each coil pattern, the relationship between the primary coils and secondary coils, and the locations of the terminals for connecting to the outside circuits. Assume that coil 1 is the primary coil and coil 2 is the secondary coil, and that both coils have a concentric spiral pattern, and that the secondary coil 2 has a current density which is larger than that of the primary coil 1. The conductor width of secondary coil 2 is wider than that of primary coil 1.

Figure 5B:
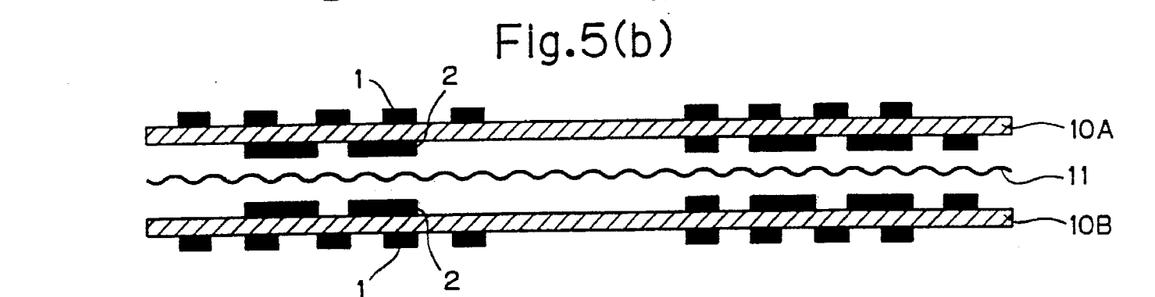

[Process (b) shown in FIG. 5(b)]

Two of the insulating substrates 10A and 10B obtained in the above discussed process (a) are laminated or otherwise disposed together with a resin sheet 11 disposed therebetween. In the embodiment, the secondary coils 2 are disposed facing each other with resin sheet 11 disposed therebetween, and primary coils 1 positioned on the outer surfaces as shown.

[Process (b1) shown in FIG. 5(b1)]

The laminated plate structure comprising the two coil substrate structures and resin sheet 11,and as shown in FIG. 5(b), is subjected to heat and pressure and is then hardened to form an integral structure. The resin from sheet 11 is melted and flows out of the sheet 11 to fill in the spaces between the coils and between the substrates and other layers as discussed above, and other spaces between the terminals and other components.

[Process (b2) shown in FIG. 5(b2)]

Through holes 51 and 52, for connecting terminals 32 and connecting terminals 33 and 41, are formed and conducting layers 50 are formed on the inner walls of the through holes by use of a plating technique or the like. The through holes 51,52 are provided through each of the layers, such as through cover sheets, and substrate, and coils, as shown, and have openings on both sides of the structure. The diameter of the holes and the thickness of the conductive layers 50 are determined by considering the density and the like of the current flowing in the connected coils. The through hole 51, connecting terminals 32, and layer 50 on the inner wall thereof connect the primary coils formed on the two coil substrate structure. Through holes 52, connecting terminals 33 and 41, and conductive layer 50 on the inner wall thereof connect the secondary coils formed on the two coil substrate structure.

Figure 5C:
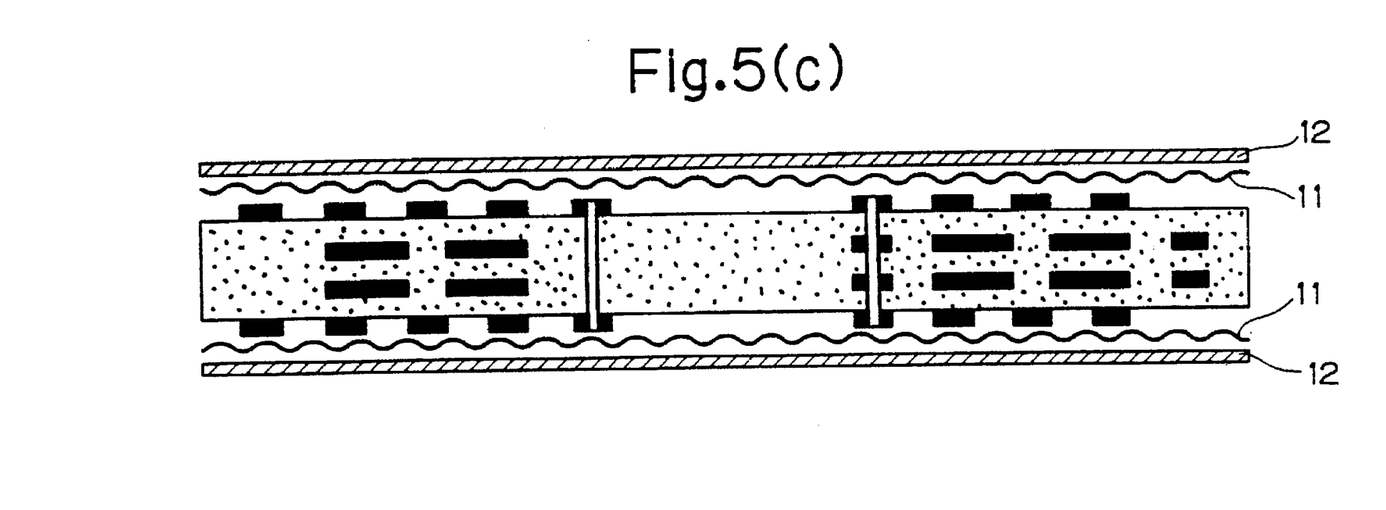

[Process (c) shown in FIG. 5(c)]

Cover sheets or coatings 12, which comprise at least an insulating layer, are laminated or otherwise disposed on the outer surfaces of the structure formed by process (b2) described above, with resin sheets 11 between the outer surfaces and the cover sheets 12. The combined structure is then again subjected to heat and pressure and then hardened thereby to form an integral structure.

The insides of through holes 51 and 52 are may be filled with resin from resin sheet 11 and the surface of conductive layer 50 may also be coated with resin. In an alternative arrangement, the inside of through holes 51, 52 are not filled with resin and are hollow, such as would be the case, if the resin in the resin sheet 11 has a viscosity that will not flow when subjected to heat.

[Process (c1) shown in FIG. 5(c1)]

Through holes 53 and 54 are formed for connecting terminals 31 and 42, such as provided on the outer periphery of the spiral coil pattern with conductive layers 50 which are formed on the inner walls of the through holes 53,54. The conductive layers 50 may be formed by using a plating technique or the like. Conductive layer 50 on the inner wall of through hole 53 connects the primary coil of the two coil substrate structure and forms terminals 31 for connecting to outside circuits. The conductive layer 50 on the inner wall of through hole 54 connects the secondary coils of the two coil substrate combination and forms terminals 42 for connecting to outside circuits.

[Process (c2) shown in FIG. 5(c2)]

The terminals 61,62 for connection to outside circuits, may comprise pins inserted into the through holes 53,54. When the laminating type molded coil is used for a transformer, a through hole 7 may be formed for suitable placement of the core.

The just described method has steps for readily forming the through holes and conductive layer on the inner walls thereof for easy interconnection of the coils and to the outside circuits.

Figure 6:
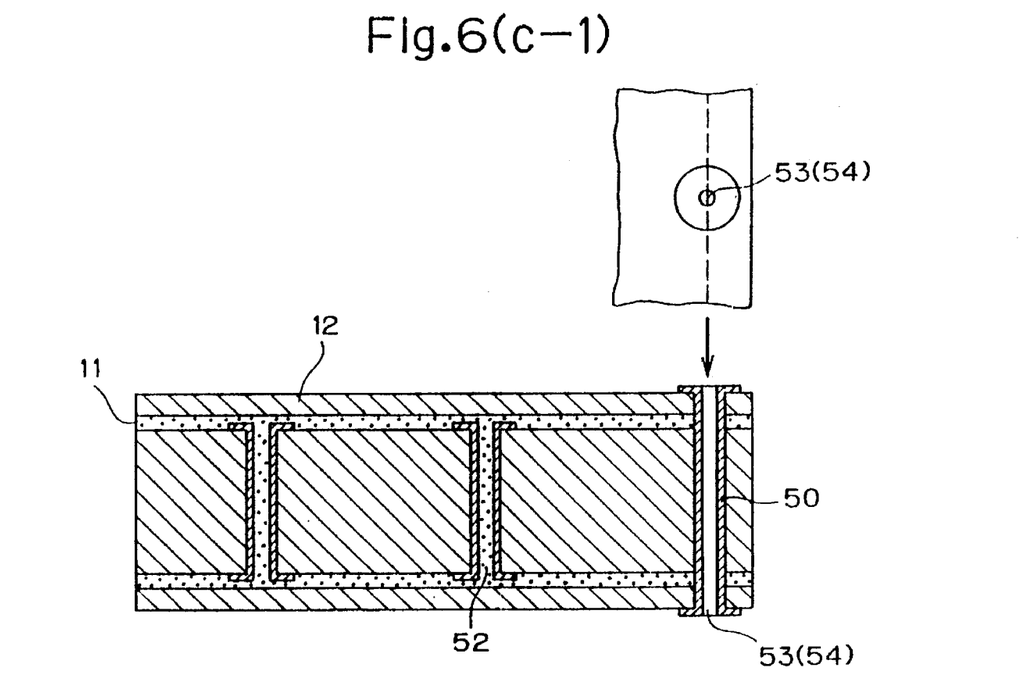

FIGS. 6(c-1) and 6(c-2) show another fabricating method wherein terminals for connecting to outside circuits are formed in the fabricating method of FIGS. 5(a)–5(c).

The same processes as shown in FIGS. 5(a)–5(c) are adapted to the method of this embodiment method. In this embodiment, as shown in FIGS. 6(c-1) and 6 (c-2), a laminated plate is cut along the broken lines so that through holes 53 or 54 becomes a semi-circle as shown in FIG. 6(c-1). Then, layer 50, on the inner wall of through hole 53 or 54, is exposed to the outer periphery, as shown in FIG. 6(c-2) which may be used as a semi-cylindrical terminal for connecting to the outside circuits. The cutting of the laminated plate may be carried out together with such operations as separating the laminated plates, for example.

The embodiment eliminates the process for specially providing terminals or pins, such as shown in FIG. 5(C2),for connecting to an outside circuit. This enables further reduction of costs.

Figure 7:
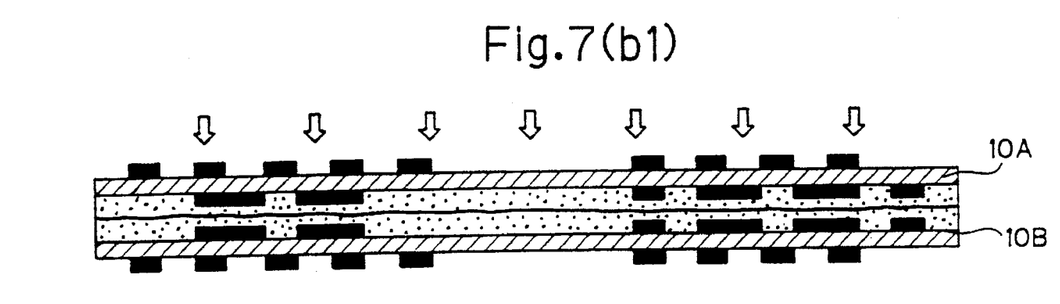
Figure 7A:
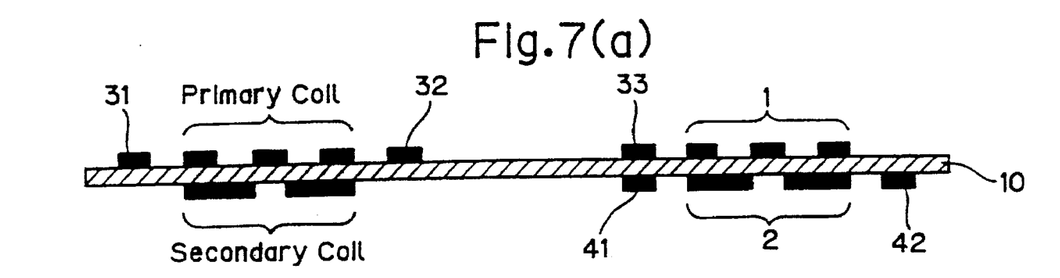
Figure 7B:
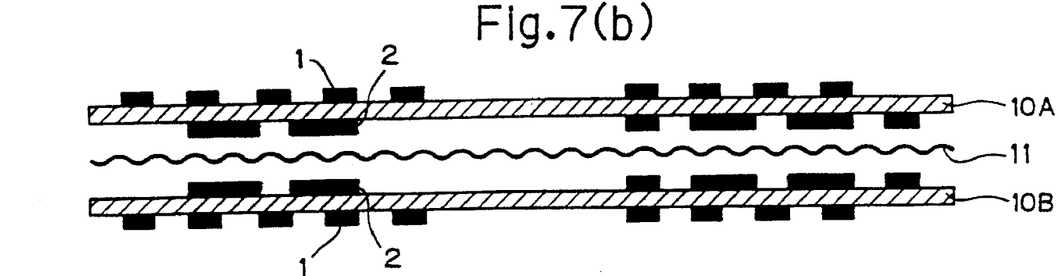

FIGS. 7(a)–7(c1) show another method for fabricating a laminating type molded coil using a plurality of coil substrate structures and wherein coils are electrically connected to each other within the molded structure.

[Process (a)–(b1) shown in FIGS. 7(a)–7(b1)]

A plurality of coil substrate structures are laminated together to form an integral structure. These are the same as those shown in FIGS. 5(a)–5(c2) and an explanation thereof is omitted for sake clarity.

[Process (b2), shown in FIG. 7(b2)]

Through holes 51 and 53 having conductive layers 50 on the inner walls thereof for connecting terminals 31. Through holes 52,54 have conductive layers 50 on the inner walls thereof for connecting the coils to terminal 33, and for interconnecting the periphery side of the spiral coil. Conductive layer 50 on the inner wall of hole 54 connects terminal 42 provided on the outer periphery side of the coil pattern.

Figure 7C:
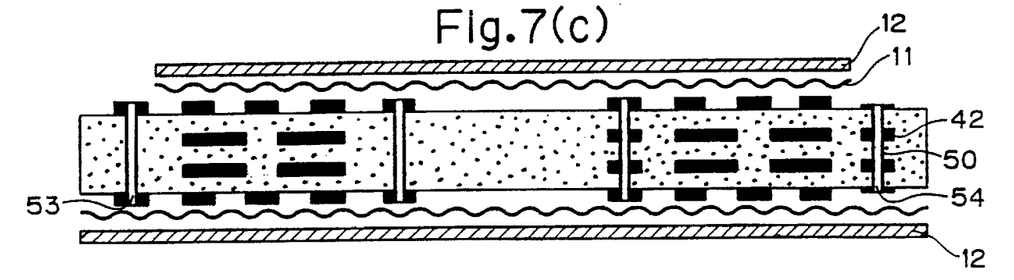

[Process (c) shown in FIG. 7(c)]

Cover sheets 12, which are of insulating material, are laminated on the two surfaces of the plate on which through holes 51,52,53 and 54 are formed. Resin sheet 11 and cover sheet 12 are of suitable dimensions so as to avoid covering holes 53 and 54 on the upper surface as depicted. After laminating operation, the laminated plate comprising coil substrate structures, resin sheet 11 and cover sheet 12 is again subjected to heat and pressure and the resin which is liquified and fills the various gaps is hardened thereby to form an integral structure. The sheet 11 may comprise a resin which has a fluidity property that does not flow when heated and resin does not cover the holes 53,54 when subjected to the heating and pressurizing.

[Process (c1) shown in FIG. 7(c1)]

Terminal pins 61,62, for connecting to outside circuits, are coupled to through holes 53,54 provided on the outer periphery side of the spiral coil pattern and exposed to the surface, as depicted. In some arrangements the pins are connected to the conductive layers 50 on the inner walls of the through holes.

Advantageously, the fabrication method may be completed by a one step process.

Figure 8:
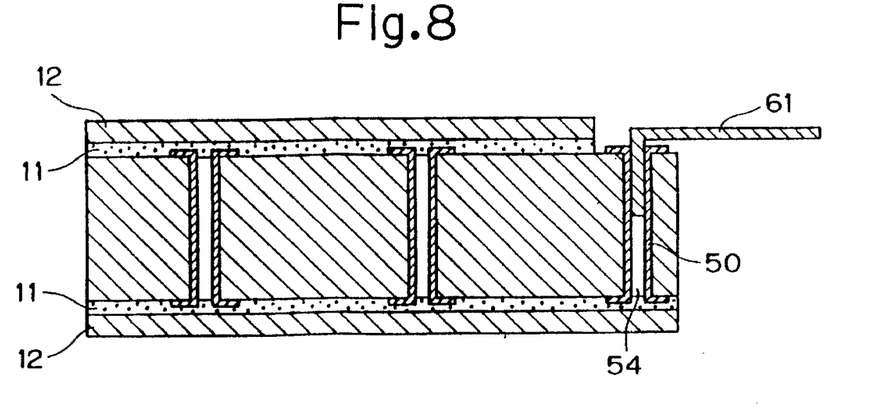
FIG. 8 is a cross sectional view depicting another exemplary terminal structure.

FIG. 8 shows a terminal structure, wherein a connecting terminal pin 61, inserted in through hole 54 and connected to conductive layer 50 therein, is formed in an "L" shape to make a right angle with a center axis of the through hole 54, so that the connecting pin 61 is led out in the direction of the plane of the laminated plane, as depicted.

Figure 9:
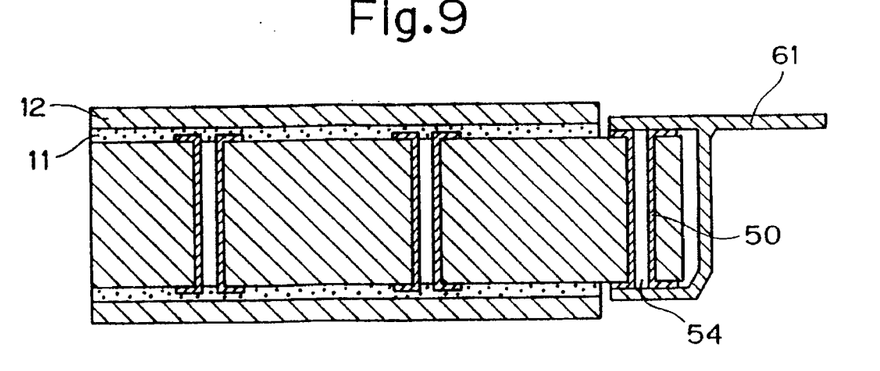
FIG. 9 is a cross sectional view depicting a further exemplary terminal structure.

FIG. 9 shows another terminal structure, wherein the laminated plate is constructed so that a section of through hole 54 is not covered by resin sheet 11 and cover 12 on the top and bottom sides and conductive layer 50 is on the inner wall of hole 54 and flares outward at the ends thereof. The connecting terminal pin 61 is formed in the shape of a clip so as to pinch the conductive layer 50 formed in through hole 54 from both sides, as depicted.

Figure 10:
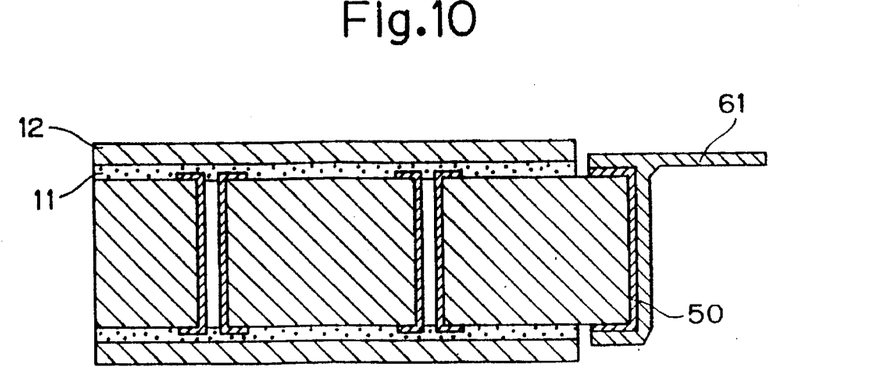
FIG. 10 is a cross sectional view depicting a still further exemplary terminal structure.

FIG. 10 shows a further terminal structure wherein the through hole 54 is cut axially so that the remainder of the hole is semi-circular in shape (the same as shown in FIG. 6), and connecting pin 61 has a clip-like structure which contacts the remainder conductive layer 50 on the inner wall of hole 54 exposed to the outside and pinches the conductive layer flared from the ends of through hole 54 from both sides.

Figure 11:
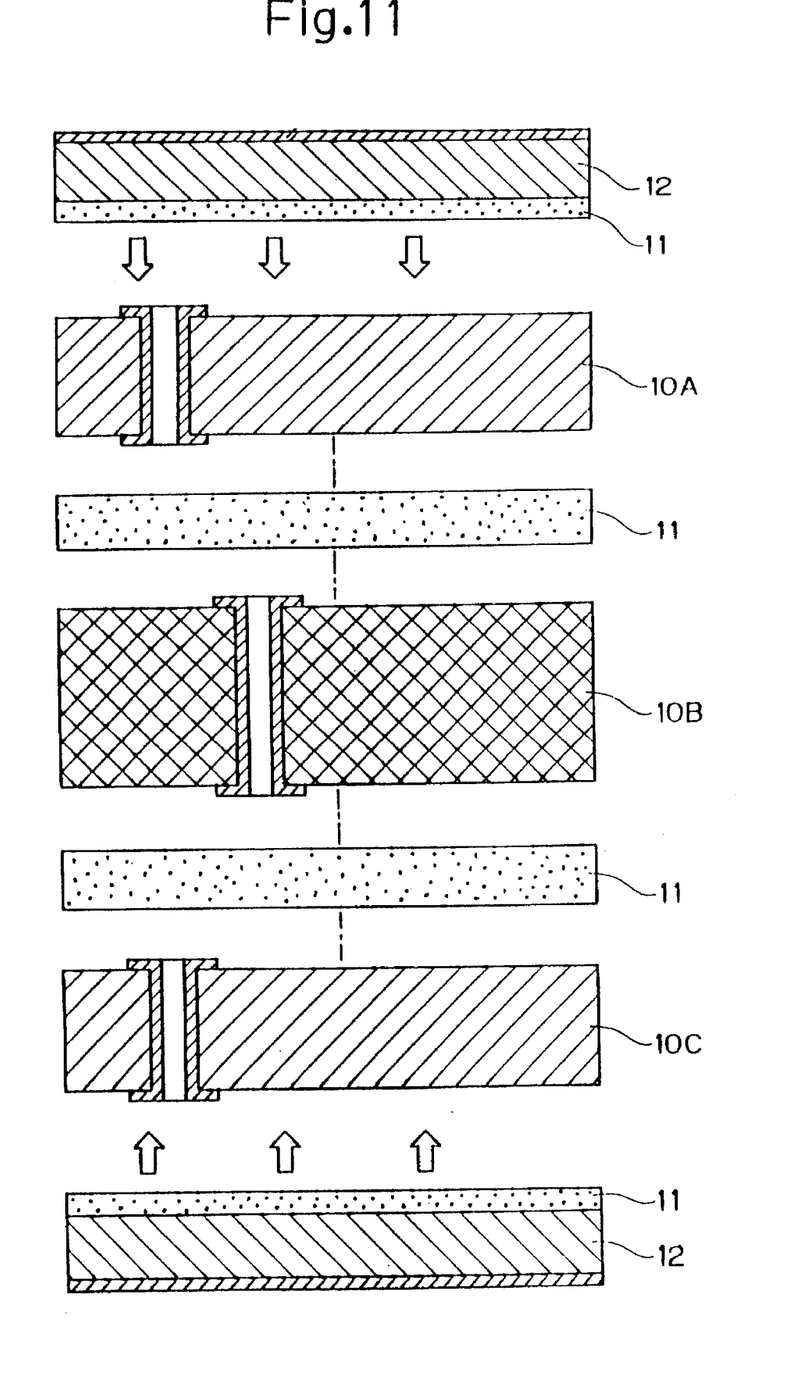
FIG. 11 is an explanatory view depicting the steps of a still further illustrative fabricating method of the invention.

FIG. 11 shows the steps of another illustrative method which is a combination of the fabricating steps shown in FIG. 5. In the embodiment, it is assumed that a number of coil substrate structures 10A, 10B and 10C, are laminated together. It should be noted that in the description of the various layers, we have used the term laminated. The layers can be laminated together using a suitable method, such as attaching together with suitable adhesive, bonding and the like. The layers can also be unified into an integral structure by the hardening of the resin. The term laminated plate means the structure which includes the coil substrate structure and the one more layers, such as the resin sheet and cover sheet. Such term would include those structures wherein no actual laminating is involved but integrating by use of the resin may be involved. Returning again to the description of FIG. 11, the through holes are formed in each multi-layered plate at a predetermined location. The laminated plates are laminated with the resin sheets 11 disposed therebetween, as depicted, and with insulating cover sheets 12 disposed on the outermost surfaces of the resin sheets, and the combined components are subjected to heat and pressure thereby to form an integral structure. The outermost surfaces of cover sheets 12 are covered with a copper film, as depicted.

FIGS. 12(a)–12(d) show a further illustrative fabricating method, wherein a large number of laminating type molded coils having the same size are fabricated at the same time.

Figure 12A:
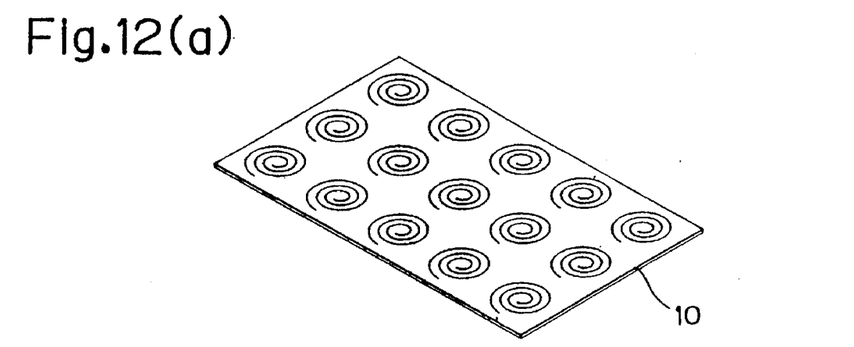

[Process (a) shown in FIG. 12(a)]

The primary and secondary coils, shown as spirals, are formed, respectively, on both sides of an insulating substrate 10 by use of a printed wiring technique so that a plurality of coils are formed in an array comprising a plurality of vertical and horizontal lines.

Figure 12B:
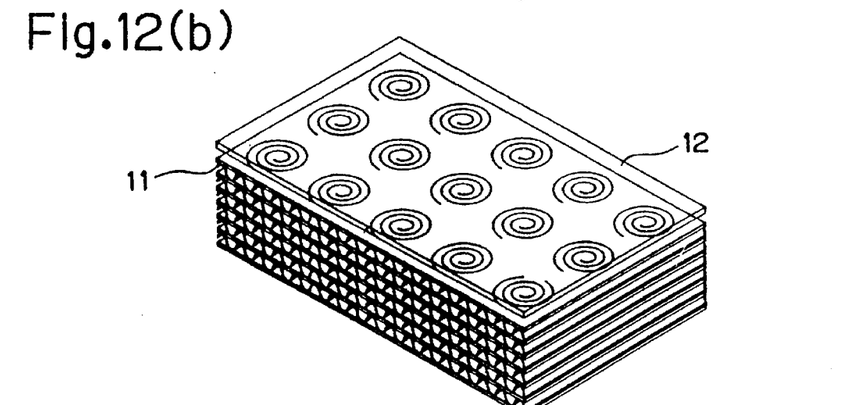

[Process (b) shown in FIG. 12(b)]

A plurality of sheets of arrays of coil substrate structures formed in process (a) are laminated together with resin sheets 11 between each sheet of arrays and with cover sheets 12 on the outer most surfaces. The covering sheets may comprise a semi-transparent insulating material. The combined sheets of arrays, resin layers, and cover sheets are subjected to heat and pressure and the resin caused to harden thereby to form an integral structure. The process may also include the forming of through holes and conductive layers on the inner walls thereof in a manner to the steps outlined above.

Figure 12C:
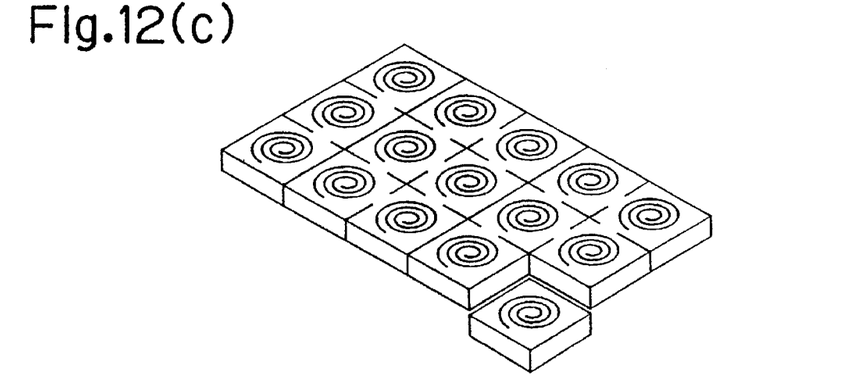

[Process (c) shown in FIG. 12(c)]

The integral laminated plate structure obtained in above process (b) is cut along the broken lines to form a predetermined number of units, each containing the coil pattern.

It is also possible to cut along the through hole in an axial direction to form semi-circular connecting terminals, such as described with reference to FIG. 4.

The process for forming a hole for providing a core may be carried out before or after the cutting. The cutting operation may be carried out by use of an appropriate cutter, for example.

Figure 12D:
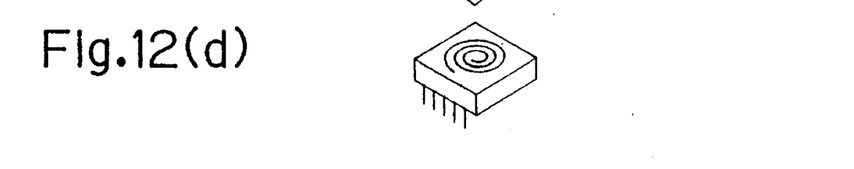

[Process (d) shown in FIG. 12(d)]

Terminals, for connecting to outside circuits, are connected to each laminating type molded coil unit cut in the above process (c). This method enables the easy fabrication of a large number of laminating type molded coils having the same qualities at the same time. Also, advantageously, the method produces very little waste and the utilization of materials is high.

Although the conductive layer 50 is provided on the inner wall of the through holes for connecting associated coils in laminating two or more coil substrate structures, the through holes may also be filled with solder or conductive resin to serve similar purposes. Such structure may be realized by implementing reflow soldering or by dipping on the laminated plate or by press fitting the conductive resin by a printing method.

Furthermore, it is possible to laminate more than two sheets of arrays in the surface direction and having two or more coils in one unit cut therefrom.

According to the invention, the following advantages and effects are attained. The plane insulating substrate, resin sheets and cover sheets are laminated and then are heated and pressurized to form an integral unitary structure. Thus, a molding box is not needed, such as is needed in the prior art, to mold the components. Also, a laminating type molded coil having the same quality as those found in the prior art can also be obtained utilizing a much simpler method in the invention. Also, the coil patterns are formed on the insulating substrate by use of a printed wiring technique. Thus, conductor width, distance between conductors, and thickness of the conductor and layers can be accurately controlled by use of printed wiring techniques. Moreover, advantageously, the laminating type molded coil of the invention is produced by use of simple processes, such as heating and pressurization and by forming through holes. Thus, the invention reduces costs considerably.

The laminating type molded coil of the invention can be used in various fields. For example, it can be used as an antenna for transmitting and receiving electromagnetic waves; it can be used as a coil for detecting magnetic fields; and it can be used as a transformer in which the laminating type molded coil is used in combination with a core.

Figures 13A, 13B, 14:
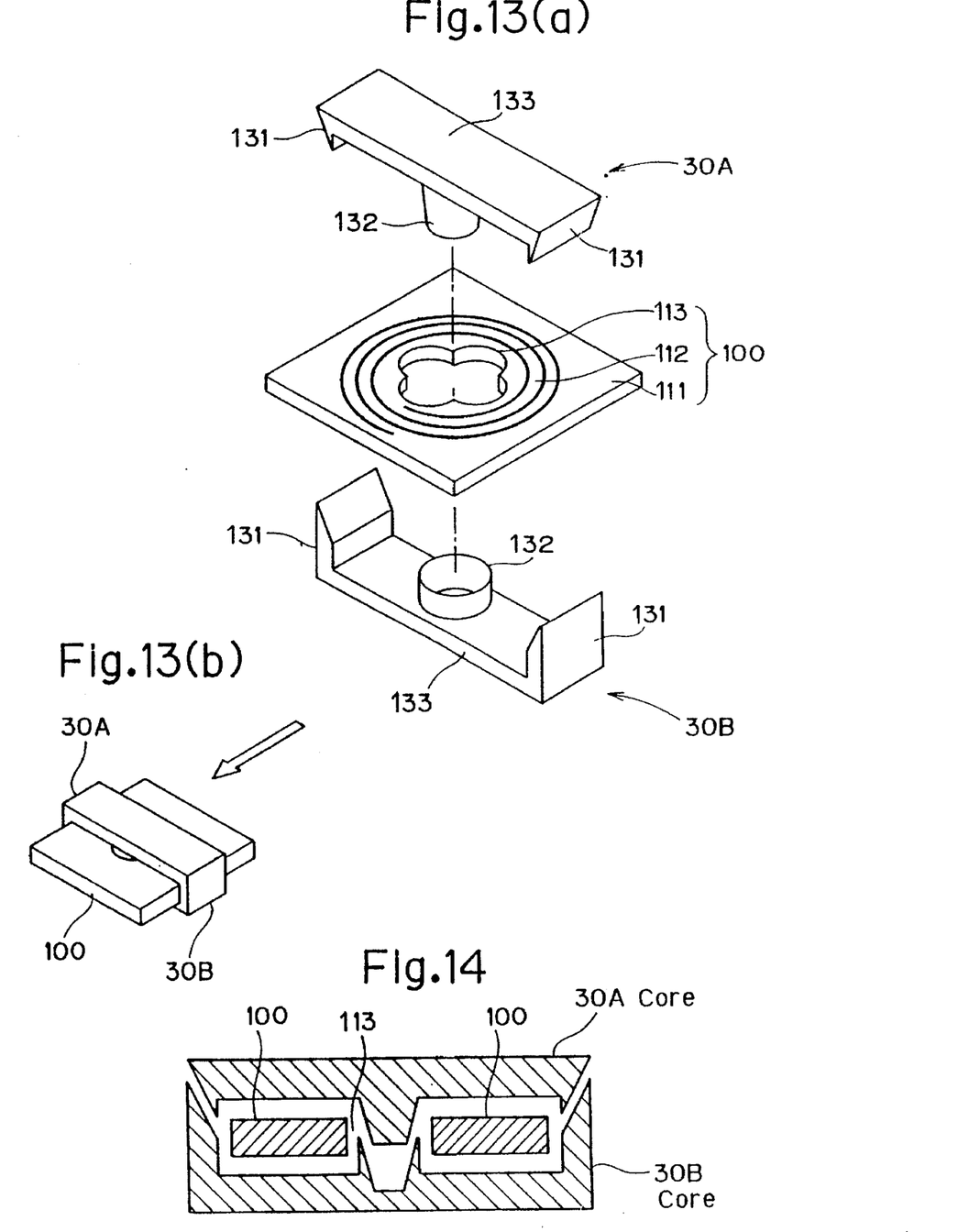
FIGS. 13(a) and 13(b) are assembly views depicting the construction of a transformer unit using the molded coil produced by the method of FIGS. 4(a)–4(c).
FIG. 14 is a cross sectional view depicting a transformer unit assembled in FIGS. 13(a) and 13(b).

FIGS. 13(a), 13(b) and 14 show an inventive laminating type molded coil used in a transformer unit, wherein FIG. 13(a) is an exploded assembly view, FIG. 13(b) shows finished components thereof, and FIG. 14 shows a sectional view of the transformer unit. A laminating type coil-substrate structure 100 is fabricated using, for example, the processes shown in FIGS. 4(a)–4(c), wherein spiral pattern coils 112 are formed on both sides of an insulating substrate 111 by use of a printed wiring technique, such as etching, evaporation and electrolysis plating, and a through hole 113 for inserting a core is formed in the center portion of the spiral pattern 112. Although one coil substrate structure is shown, two or more such coil substrate structures can be used depending on the type of core, number of turns, etc, that are desired.

Cores 30A and 30B comprise a ferrite,for example, to create a magnetic path. The cores 30A and 30B are held and fixed by inserting a middle foot core 132 into through holes 113 from both sides of the coil substrate structure 100, and caulking between the cores 30A and 30B and coil substrate structure 100.

In cores 30A and 30B, both side foot cores 131 are provided on both sides with a middle foot core 132 disposed therebetween and both side foot cores 131 and 132 are coupled by a link section 133. While middle foot core 132 of upper core piece 30A is tapered and of generally convex shape, middle foot core 132 of the lower core piece 30B is formed into a generally concave shape to fit the generally convex section of middle foot core of upper piece 30A into the generally concave section to fix the two together (see FIG. 14). Further, lower middle foot core 132 contacts the side wall of through hole 13 of coil substrate structure 100 and is held and fixed to coil substrate structure 100 by means of caulking.

Both side foot cores 131 of each core piece 30A, 30B are tapered so that each contact area of the upper and lower core pieces 30A, 30B becomes large.

A transformer unit having the structure shown in FIG. 13(b) is produced by inserting the middle foot section of the two core pieces 30A and 30B to the through hole 113 and by coupling together both pieces 30A and 30B.

Figure 15:
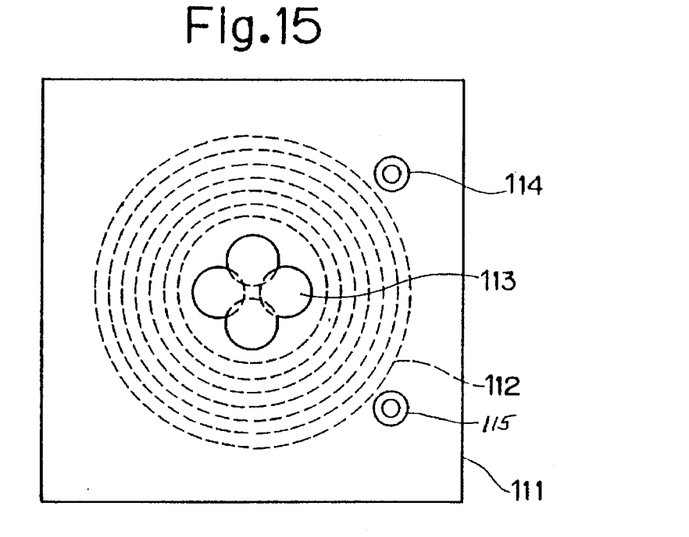
FIG. 15 is a plan view depicting a coil substrate structure used in the transformer shown in FIGS. 13(a) and 13(b).

FIG. 15 shows coil substrate structure 100, wherein through hole 113 is formed by combining four circles on coil substrate structure 100. The through hole 113 has a shape which is formed by stepped perforation using a small diameter drill, and by projecting portions created at the positions where the circles cross each other so as to hold and fix the core more rigidly. Connecting terminal pins are provided in terminal sections 114 and 115 to which one end of the coil pattern 112 is appropriately connected to connect coil 112 to an outside circuit.

The transformer unit constructed as above described is fabricated as follows.

[Process (a)]

First, the coil substrate structure 100, in which a spiral coil pattern 112 is formed on the surface of insulating substrate 111, is prepared. The width, thickness and number of turns of the spiral coil pattern 112 formed on the insulating substrate 111 are determined by taking into consideration the density of current, etc. The coils 112 which need to be, such as a primary coil and a secondary coil, are separately formed on both sides of insulating substrate 111.

If the number of turns of coil 112 or type of coil needs to be increased, a plurality of coil substrate structures may be formed. The laminated plate comprising a plurality of coil substrate structures may be obtained by a simple process using resin sheets between the coil substrate structures and by applying heat and pressure to the combined structures.

That is, the resin sheet disposed between the coil substrate structures contains resin material which can be liquified and applied to spaces between the various parts of the entire structure and then hardened to make an integral unitary device therefrom.

[Process (b)]

A through hole 113 is formed in the middle portion of spiral coil pattern 112 on coil substrate structure 100. The through hole 113 may be formed by using a drill or laser beam. The position of the through hole 113 is determined by considering the position of the coil pattern and the size of the middle foot core.

[Process (c)]

Two pieces of upper and lower cores 30A and 30B are prepared. Cores 30A and 30B are fitted together by inserting middle foot core 132 through hole 113 and from both sides of coil substrate structure 100 and the cores 30A, 30B are held and fixed to through hole 113 of the core substrate structure 100 by caulking. Because the coil substrate structure 100 is comprised mainly of an insulating substrate such as an epoxy resin as described above, the cores fitted through hole 113 may be held and fixed therein by caulking, whereby the resiliency is exploited fully thereby.

It is possible to also use an adhesive or the like to mount the two cores at the sections where they contact one another.

Figures 16A, 16B:
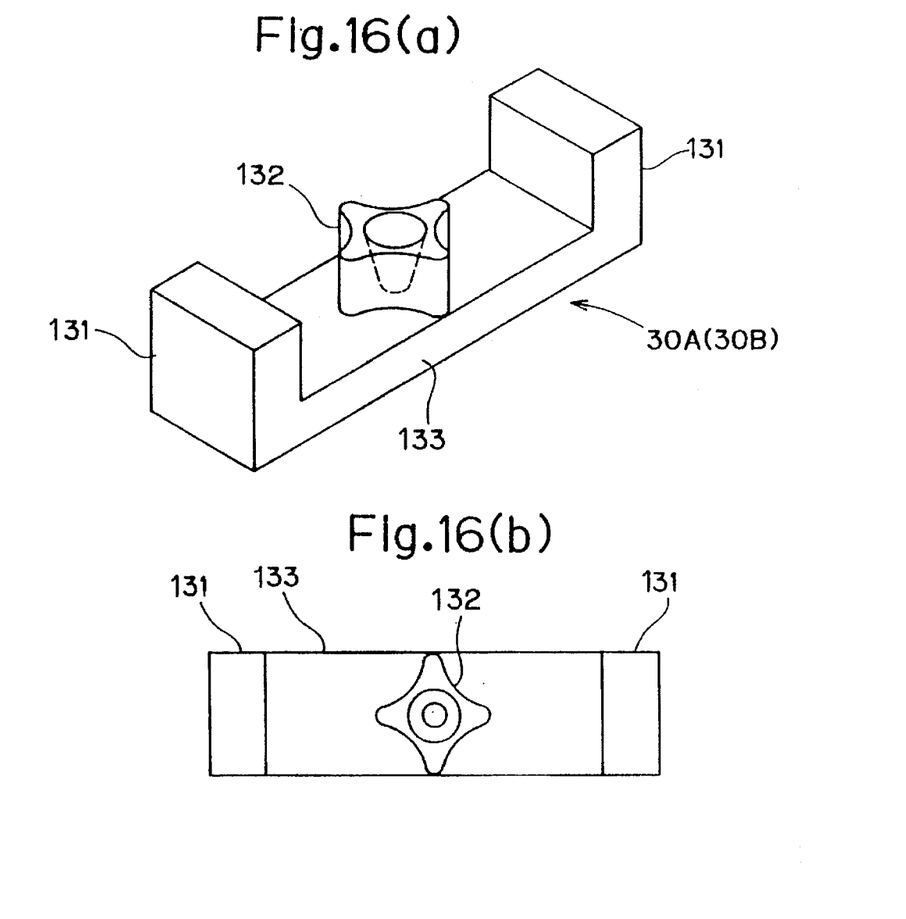
FIGS. 16(a) and 16(b) are explanatory views depicting another construction of core pieces 30A and 30B shown in FIGS. 13(a) and 13(b).

FIGS. 16(a) and 16(b) show another construction of the core wherein FIG. 16(a) is a perspective view, and FIG. 16(b) is a plan view. In the embodiment, a sectional shape of middle foot core 132 is tapered in the shape of a star. A generally concave section is created inside of the middle foot core to enable the middle foot core to fit into the middle foot core of another core piece. The generally concave section need not be provided in the middle foot core when it is coupled to another core by means of an adhesive or the like.

According to the embodiment, star shaped projecting portions bite into the side wall of the through hole even if the shape of the through hole is circular. Thus, the cores may be readily held and fixed by coil substrate structure by caulking.

The transformer unit constructed as described above is fabricated by a simple procedure because the coil substrate structure and core can be held and fixed by use of caulking. Further, when the shape of the through hole, provided in the coil substrate structure, is formed by combining circles, positional accuracy for mounting the core pieces is high because the middle foot core is held and fixed by a plurality of side wall projecting portions formed on the through hole 113.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A laminating type molded coil comprising
at least one insulating substrate having at least one coil formed on either side thereof by a printed wiring technique thereby to form a coil substrate structure;
a resin sheet disposed on either side of said coil substrate structure; and
an insulating covering sheet disposed on outermost surfaces of said resin sheet, wherein
spaces between said covering sheet and said coil substrate structure and adjacent said coil are filled with resin from said resin sheets.

2. The coil of claim 1, wherein said coil substrate structure has at least one through hole therein, and a conductive layer disposed on an inner wall of said at least one through hole, said conductive layer connected to said at least one coil.

3. The coil according to claim 2, wherein said at least one through hole is filled with resin.

4. The coil of claim 1, wherein said coil substrate structure and covering sheet have at least one through hole therein, and a conductive layer is disposed on an inner wall of said at least one through hole, said conductive layer being connected to a terminal formed on said coil substrate structure for connection to an outside circuit.

5. The coil of claim 4, wherein said coil substrate structure and covering sheet are cut so that a substantially semi-circular shaped remains of the at least one through hole and conducting layer disposed on an inner wall thereof remain.

6. The coil of claim 1, wherein a primary coil is formed on one surface of said insulating substrate and a secondary coil is formed on another surface of said insulating substrate, and wherein said insulating substrate has sufficient capacity to withstand voltage applied to said primary coil.

7. A method for fabricating a laminating type molded coil, comprising the steps of forming coils on both sides of an insulating substrate using a printed wiring technique thereby to form a coil substrate structure;

disposing resin sheets on both sides of said coil substrate structure;

placing insulating cover sheets on outermost surfaces of said resin sheets; and applying heat and pressure to the structure formed by the foregoing steps to cause spaces between the coils and between the coil substrate structure and said covering sheets to be filled with resin from said resin sheet, and then hardened, thereby to produce an integral structure.

8. The method of claim 7, wherein further comprising the steps of forming at least one through hole in said coil substrate structure, and of forming a conductive layer on an inner wall of said at least one through hole.

9. The method of claim 8, wherein further comprising the steps of applying heat and pressure again to cause said resin to fill said at least one through hole.

10. The method of claim 8, further comprising the steps of placing said insulating cover sheets on said outermost surfaces of said resin sheets excluding an area where said at least one through hole is located.

11. The method of claim 7, wherein further comprising the steps of forming a plurality of coil substrate structures, inserting a resin sheet between pairs of said coil substrate structures, and on an outermost surface thereof, and placing a pair of insulating covering sheets on the outside of said outermost surfaces of said resin sheets.

12. A method of fabricating a laminating type molded coil, comprising the steps of forming a plurality of coils on both sides of an insulating substrate by use of a printed wire technique thereby to form at least one coil substrate structure;

disposing resin sheets on both sides of said at least one coil substrate structure;

placing insulating cover sheets on outermost surfaces of the structure obtained from the previous steps;

applying heat and pressure to said structure obtained from the previous steps thereby to fill spaces between said coils and between said coil substrate structure and said covering sheet with resin from said resin sheet, and hardening said resin thereby to produce an integral structure; and cutting the resulting integral structure into a plurality of units each containing at least one said coil on one side and at least one said coil on the other side of said insulating substrate.

13. A transformer unit comprising a laminating type molded coil, wherein said laminating type molded coil comprises at least one coil substrate structure in which a spiral coil is formed on surfaces of an insulating substrate, and wherein cores are disposed in a through hole formed in middle of said spiral coil, said cores being held and fixed in said through hole of said coil substrate structure by caulking.

14. The transformer unit of claim 13, wherein said through hole has a shape combining at least two circles to hold and fix said cores at projecting portions whereat said circles cross each other.

15. The transformer unit of claim 13, wherein one side of a coupling section of cores is provided on both sides of said coil substrate structure via said through hole of said coil substrate structure, said one side being formed in a generally concave shape and the other side being formed in a generally convex shape.

16. A method of fabricating a transformer unit comprising the steps of forming a through hole in middle of a spiral coil disposed on a coil substrate structure in which said spiral coil is formed on an insulating substrate;

inserting a middle foot core in said through hole; and holding and fixing said core in said through hole by caulking.

* * * * *